United States Patent
Hou et al.

(10) Patent No.: US 9,911,795 B2
(45) Date of Patent: Mar. 6, 2018

(54) PIXEL UNIT AND METHOD OF MANUFACTURING THE SAME, LIGHT EMITTING DEVICE AND DISPLAY DEVICE

(71) Applicant: BOE TECHNOLOGY GROUP CO., LTD., Beijing (CN)

(72) Inventors: Wenjun Hou, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/038,183

(22) PCT Filed: Oct. 20, 2015

(86) PCT No.: PCT/CN2015/092259
§ 371 (c)(1),
(2) Date: May 20, 2016

(87) PCT Pub. No.: WO2016/074554
PCT Pub. Date: May 19, 2016

(65) Prior Publication Data
US 2016/0293683 A1    Oct. 6, 2016

(30) Foreign Application Priority Data
Nov. 14, 2014    (CN) .......................... 2014 1 0646200

(51) Int. Cl.
*H01L 27/32* (2006.01)
*H01L 51/56* (2006.01)
*H01L 51/00* (2006.01)

(52) U.S. Cl.
CPC ........ *H01L 27/3246* (2013.01); *H01L 51/001* (2013.01); *H01L 51/0005* (2013.01); *H01L 51/56* (2013.01); *H01L 2227/323* (2013.01)

(58) Field of Classification Search
CPC ..................... H01L 27/3246; H01L 51/0005
(Continued)

(56) References Cited

U.S. PATENT DOCUMENTS

2005/0153468 A1    7/2005   Gupta et al.
2006/0238111 A1   10/2006   Shimizu et al.
(Continued)

FOREIGN PATENT DOCUMENTS

CN    1446028 A      10/2003
CN    101529597 A     9/2009
(Continued)

OTHER PUBLICATIONS

International Search Report dated Feb. 2, 2016 corresponding to International application No. PCT/CN2015/092259.
(Continued)

*Primary Examiner* — Fernando L Toledo
*Assistant Examiner* — Adam S Bowen
(74) *Attorney, Agent, or Firm* — Nath, Goldberg & Meyer; Joshua B. Goldberg; Annie J. Kock

(57) ABSTRACT

The present invention discloses a pixel unit, which comprises a pixel defining layer defining a pixel region, a first electrode within a central area of the pixel region, an organic-light-emitting-display-device functional layer formed within the pixel region and on the first electrode, and a second electrode formed on the organic-light-emitting-display-device functional layer, an area of a bottom plane of the organic-light-emitting-display-device functional layer being larger than that of an upper surface of the first electrode. The pixel defining layer comprises first and second pixel defining portions having ring-shaped structures, the first pixel defining portion has an inner side surface defining the pixel region, and the second pixel defining portion has an outer side surface in contact with the inner
(Continued)

side surface of the first pixel defining portion, and is disposed around the first electrode. The first pixel defining portion has a thickness greater than the second pixel defining portion.

20 Claims, 3 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2009/0321725 A1 | 12/2009 | Yoshida et al. | |
| 2011/0008590 A1 | 1/2011 | Goddard et al. | |
| 2012/0176570 A1* | 7/2012 | Yamazaki | G02F 1/1334 349/86 |
| 2013/0001603 A1* | 1/2013 | Lim | H01L 51/5209 257/88 |
| 2013/0038203 A1* | 2/2013 | Kim | H01L 51/5215 313/504 |
| 2013/0321482 A1* | 12/2013 | Goro | G09G 5/10 345/690 |

FOREIGN PATENT DOCUMENTS

| | | |
|---|---|---|
| CN | 101543135 A | 9/2009 |
| CN | 101543136 A | 9/2009 |
| CN | 101689559 A | 3/2010 |
| CN | 102956669 A | 3/2013 |
| CN | 103681765 A | 3/2014 |
| CN | 104409647 A | 3/2015 |
| EP | 1729358 A1 | 12/2006 |
| JP | 2005222776 A | 8/2005 |

OTHER PUBLICATIONS

First Office Action dated May 3, 2016 corresponding to Chinese application No. 201410646200.4.

Second Office Action dated Oct. 10, 2016 corresponding to Chinese application No. 201410646200.4.

Written Opinion of the International Searching Authority dated Feb. 2, 2016 corresponding to International application No. PCT/CN2015/092259.

* cited by examiner

PIXEL UNIT AND METHOD OF MANUFACTURING THE SAME, LIGHT EMITTING DEVICE AND DISPLAY DEVICE

This is a National Phase Application filed under 35 U.S.C. 371 as a national stage of PCT/CN2015/092259, filed Oct. 20, 2015, an application claiming the benefit of Chinese Application No. 201410646200.4, filed Nov. 14, 2014, the content of each of which is hereby incorporated by reference in its entirety.

FIELD OF THE INVENTION

The present invention relates to the field of display technology, and specifically relates to a pixel unit and a method of manufacturing the same, a light emitting device and a display device.

BACKGROUND OF THE INVENTION

For an organic light-emitting device, light is emitted by an organic thin film formed of an organic light-emitting material. In conventional structures of a pixel unit, the luminance of the organic light-emitting device depends on the thickness of the organic thin film, and the entire organic light-emitting device has a uniform luminance when the organic thin film has a uniform thickness. In practice, however, the thickness of the organic thin film of the organic light-emitting device is not uniform due to the imperfection of the manufacture process.

For example, a solution process may be employed to form the organic thin film in the procedure of manufacturing the organic light-emitting device, which is applicable for a polymeric organic light-emitting material and a soluble-micromolecule organic light-emitting material and is characterized by the low cost for manufacture apparatus, thereby having a distinct advantage in massive production for large sizes. In the case of manufacturing a full-color organic light-emitting device, an inkjet printing technology, among the technologies of solution process, is generally used. In the inkjet printing technology, the solution is jetted into a pixel region accurately by a piezoelectric nozzle and then the solvent of the solution is removed by evaporation, such that the organic thin film is formed within the pixel region. However, due to the difference of the evaporation rate of the solvent at an edge area and at a central area of the pixel region, it is difficult to form an organic thin film having a uniform thickness within the pixel region.

FIG. 1 shows a structure of a pixel unit in the prior art, the pixel unit including a substrate 100, a pixel defining layer 101, a pair of pixel electrodes 102 and 104, and an organic-light-emitting-display-device functional layer (i.e., an organic thin film) 103. A pixel region is defined by the pixel defining layer 101, the pixel electrode 102 is positioned within the pixel region, and the organic-light-emitting-display-device functional layer 103 is positioned on the pixel electrode 102. After preparing the organic-light-emitting-display-device functional layer 103 by the inkjet printing technology and the like, since the solvent at the edge area of the organic-light-emitting-display-device functional layer 103 has a higher vapor pressure than that of the solvent at the central area of the organic-light-emitting-display-device functional layer 103, the evaporation rate of the solvent at the edge area is faster than that of the solvent at the central area, such that the concentration of the solution at the edge area of the organic-light-emitting-display-device functional layer 103 is higher than that of the solution at the central area thereof, and the solution at the central area may flow towards the edge area, which causes the thickness of the edge area of the organic-light-emitting-display-device functional layer 103 to be always greater than that of the central area. When a voltage is applied to the organic-light-emitting-display-device functional layer 103 by the pixel electrodes 102 and 104, both the edge area and the central area of the functional layer 103 may emit light, and the luminance of the central area of the pixel region is higher than that of the edge area of the pixel region due to the nonuniformity of the thickness of the functional layer 103, which causes the nonuniformity of the luminance of the organic light-emitting device.

In the prior art, the nonuniformity of the thickness of the organic thin film is decreased by using inkjet printing solutions which have different boiling points, adjusting the structure of the pixel defining layer, or performing surface treatment on the pixel defining layer. For example, in the European patent document EP1729358A1, the nonuniformity of the thickness of the organic thin film is decreased by the structure design of the pixel defining layer; and in the US patent publication document US 2011/0008590 A1, the shape and thickness of the organic thin film formed by the inkjet printing technology are controlled by using different high-boiling-point solutions. However, the nonuniformity of thickness of the organic thin film cannot be eliminated completely by the above technical solutions, and when using conventional structures of a pixel unit, the luminance of the central area of the pixel region in the light emitting device is higher than that of the edge area thereof due to the nonuniformity of thickness of the organic thin film.

SUMMARY OF THE INVENTION

In order to solve the above problems existing in the prior art, the present invention provides a pixel unit and a method of manufacturing the same, a light emitting device, and a display device.

According to a first aspect of the present invention, there is provided a pixel unit, which comprises a pixel defining layer defining a pixel region, a first electrode positioned within a central area of the pixel region, an organic-light-emitting-display-device functional layer formed within the pixel region and positioned on the first electrode, and a second electrode formed on the organic-light-emitting-display-device functional layer, wherein an area of a bottom plane of the organic-light-emitting-display-device functional layer is larger than that of an upper surface of the first electrode.

In the pixel unit according to the first aspect of the present invention, the pixel defining layer comprises first and second pixel defining portions having ring-shaped structures, respectively, the first pixel defining portion has an inner side surface defining the pixel region, and the second pixel defining portion has an outer side surface in contact with the inner side surface of the first pixel defining portion, and is disposed around the first electrode, wherein the organic-light-emitting-display-device functional layer is positioned on the first electrode and the second pixel defining portion.

In the pixel unit according to the first aspect of the present invention, the first pixel defining portion has a thickness greater than that of the second pixel defining portion.

In the pixel unit according to the first aspect of the present invention, the second pixel defining portion is in contact with the first electrode.

In the pixel unit according to the first aspect of the present invention, the first pixel defining portion has an inclined inner side surface.

In the pixel unit according to the first aspect of the present invention, the second pixel defining portion has a thickness equal to or greater than that of the first electrode.

In the pixel unit according to the first aspect of the present invention, the first pixel defining portion and the second pixel defining portion are formed integrally.

In the pixel unit according to the first aspect of the present invention, the thickness of the first electrode ranges from 10 nm to 400 nm.

In the pixel unit according to the first aspect of the present invention, the organic-light-emitting-display-device functional layer fits and is in contact with the inner side surface of the pixel defining layer.

According to a second aspect of the present invention, there is provided a light emitting device including the pixel unit according to the first aspect of the present invention.

According to a third aspect of the present invention, there is provided a display device including the light emitting device according to the second aspect of the present invention.

According to a fourth aspect of the present invention, there is provided a method of manufacturing a pixel unit, the method including steps of: forming a first electrode; forming a pixel defining layer and patterning the pixel defining layer, so as to define a pixel region and make the first electrode positioned within a central area of the pixel region; forming an organic-light-emitting-display-device functional layer on the first electrode, wherein a bottom plane of the organic-light-emitting-display-device functional layer has an area larger than that of an upper surface of the first electrode; and forming a second electrode on the organic-light-emitting-display-device functional layer.

In the method according to the fourth aspect of the present invention, the pixel defining layer includes first and second pixel defining portions having ring-shaped structures, respectively, the first pixel defining portion has an inner side surface defining the pixel region, the second pixel defining portion has an outer side surface in contact with the inner side surface of the first pixel defining portion and is disposed around the first electrode.

In the method according to the fourth aspect of the present invention, the first pixel defining portion has a thickness lager than that of the second pixel defining portion.

In the method according to the fourth aspect of the present invention, the step of forming the pixel defining layer specifically comprises: forming the pixel defining layer on the first electrode; performing, on the pixel defining layer on the first electrode, a photolithography process, such that an area of an exposure region is larger than that of the upper surface of the first electrode; and removing the material of the pixel defining layer positioned on the upper surface of the first electrode and thinning a side portion of the pixel defining layer, which is close to an edge of the first electrode, so as to form the first pixel defining portion and the second pixel defining portion.

In the method according to the fourth aspect of the present invention, the pixel defining layer is formed of an inorganic material, and the step of forming the pixel defining layer specifically comprises steps of:

forming, on the first electrode, a layer of inorganic material; exposing, by using a photoresist, and developing the inorganic material positioned on the first electrode, such that an area of an exposure region is larger than that of the upper surface of the first electrode; and removing the inorganic material positioned on the upper surface of the first electrode by dry etching, and thinning the side portion of the pixel defining layer, which is close to an edge of the first electrode, so as to form the first pixel defining portion and the second pixel defining portion.

In the method according to the fourth aspect of the present invention, the pixel defining layer is formed of photoresist, and the step of forming the pixel defining layer specifically comprises:

forming, on the first electrode, a layer of photoresist; and exposing and developing the photoresist positioned on the first electrode, such that an area of an exposure region is larger than that of the upper surface of the first electrode, wherein the photoresist on the upper surface of the first electrode is over exposed, and an exposure amount is controlled when exposing the photoresist close to the edge of the first electrode, such that the developed photoresist has a thickness equal to or greater than that of the first electrode, so as to form the first pixel defining portion and the second pixel defining portion.

In the method according to the fourth aspect of the present invention, the organic-light-emitting-display-device functional layer is formed by a solution process or an evaporation process.

In the present invention, by the means of improving the structure of the pixel defining layer, the area of the upper surface of the first electrode is smaller than that of the bottom plane of the organic-light-emitting-display-device functional layer, thereby causing the first electrode not to be positioned under the edge area of the organic-light-emitting-display-device functional layer. Compared with the conventional technologies, even in the case that the thickness of the edge area of the organic-light-emitting-display-device functional layer is greater than that of the central area thereof, since the first electrode is not provided under the edge area of the organic-light-emitting-display-device functional layer, light is not emitted from the edge area of the organic-light-emitting-display-device functional layer when a voltage is applied to the thin film of the organic-light-emitting-display-device functional layer by the electrodes, thereby avoiding the nonuniformity of luminance of an organic light-emitting display device.

DETAILED DESCRIPTION OF THE EMBODIMENTS

Figure 1:
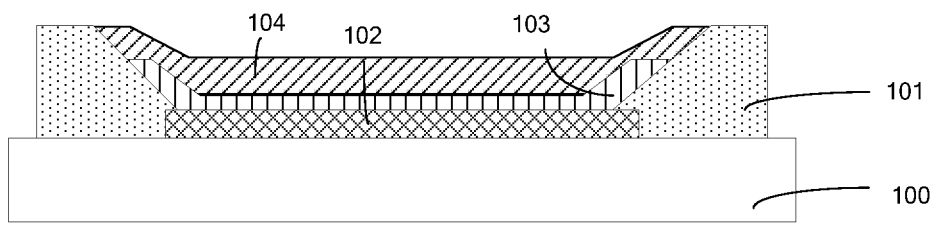
FIG. 1 is a structural schematic diagram of a pixel unit in the prior art.

In order to make an object, a technical solution as well as advantages of the present invention more apparent, the present invention will be further described in detail below in conjunction with the specific embodiments and referring to the drawings.

Figure 2:
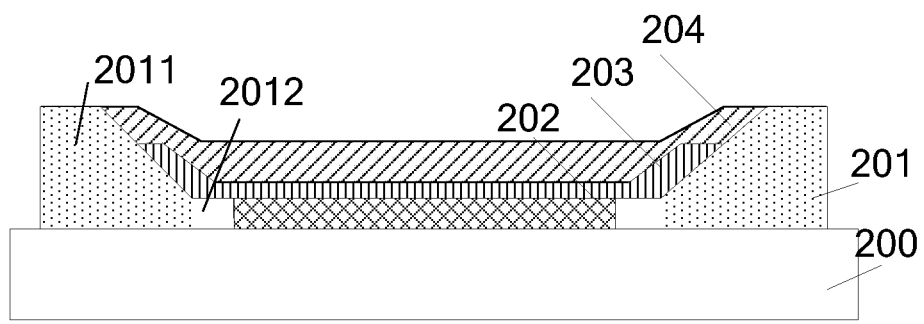
FIG. 2 is cross-sectional view illustrating a structure of a pixel unit according to an embodiment of the present invention.
Figure 3:
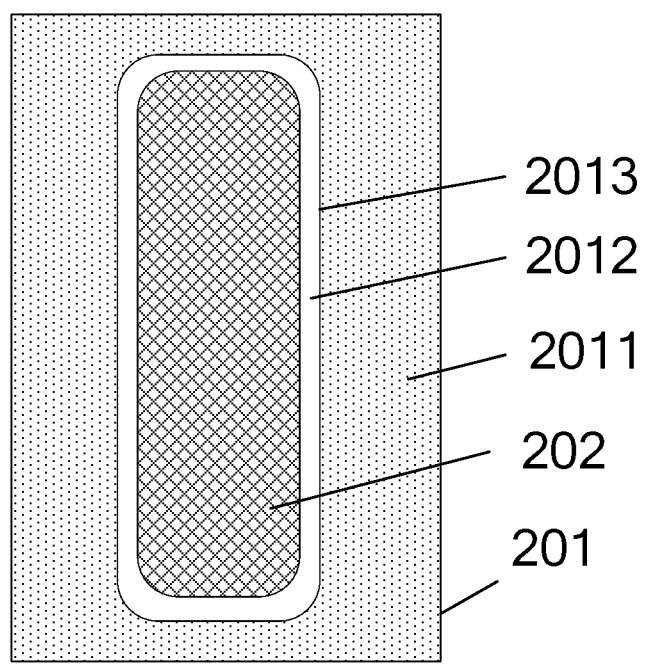
FIG. 3 is plan schematic diagram of a pixel define layer and a first electrode in a pixel unit according to an embodiment of the present invention.

FIG. 2 illustrates a cross-sectional structure of a pixel unit according to an embodiment of the present invention, and FIG. 3 illustrates a plan structure of a pixel defining layer and a first electrode in the pixel unit according to an embodiment of the present invention. As illustrated in FIGS. 2 and 3, the pixel unit includes a pixel defining layer 201, a first electrode 202, an organic-light-emitting-display-device functional layer 203 and a second electrode 204. The pixel defining layer 201 may include first and second pixel defining portions 2011 and 2012 having ring-shaped structures, respectively, wherein a region defined by an inner side surface of the first pixel defining portion 2011 is a pixel region 2013 (shown in FIG. 3), an outer side surface of the second pixel defining portion 2012 is in contact with the inner side surface of the first pixel defining portion 2011, and the first pixel defining portion 2011 has a thickness greater than that of the second pixel defining portion 2012. The first electrode 202 is positioned within a central area of the pixel region 2013, such that the second pixel defining portion 2012 is disposed around the first electrode 202. The organic-light-emitting-display-device functional layer 203 is positioned on the first electrode 202 and the second pixel defining portion 2012. The second electrode 204 is positioned on the organic-light-emitting-display-device functional layer 203.

It can be seen from FIG. 2 that, in the pixel unit according to an embodiment of the present invention, an area of an upper surface of the first electrode 202 is smaller than that of a bottom plane of the organic-light-emitting-display-device functional layer 203, in other words, the first electrode 202 is only positioned under a central area of the organic-light-emitting-display-device functional layer 203. In this case, even if the thickness of the edge area of the organic-light-emitting-display-device functional layer 203 is greater than that of the central area thereof, since the first electrode is not provided under the edge area, light is not emitted from the thick edge area of the organic-light-emitting-display-device functional layer 203 when a voltage is applied to the organic-light-emitting-display-device functional layer 203 by the electrodes 202 and 204, thereby avoiding the nonuniformity of luminance of an organic light-emitting display device.

Optionally, the pixel defining layer 201 may be made of an inorganic material such as $SiO_2$, $SiN_x$ or the like, and may also be made of an organic material such as a photoresist. The first pixel defining portion 2011 and the second pixel defining portion 2012 may be formed integrally.

Optionally, the pixel defining layer 201 may be formed on a substrate 200. The substrate may be a glass substrate or an array substrate provided with an array circuit. The pixel defining layer 201 may include the first pixel defining portion 2011 and the second pixel defining portion 2012, the first and second pixel defining portions have ring-shaped structures, respectively, the inner side surface of the first pixel defining portion 2011 is in contact with the outer side surface of the second pixel defining portion 2012, and the thickness of the first pixel defining portion 2011 is greater than that of the second pixel defining portion 2012. That is, the second pixel defining portion 2012 is formed at the edge area of the pixel region 2013, which is defined by the inner side surface of the first pixel defining portion 2011, and the first electrode 202 is formed at the central area of the pixel region 2013, such that the second pixel defining portion 2012 is disposed around the first electrode 202. It can be seen that the area of the pixel region 2013, which is defined by the inner side surface of the first pixel defining portion 2011, is larger than that of a region in which the first electrode 202 is formed. In FIG. 2, the second pixel defining portion 2012 is in contact with the first electrode 202, but the embodiments of the present invention are not limited thereto, and the second pixel defining portion 2012 may also be spaced apart from the first electrode 202.

FIG. 2 illustrates that the first pixel defining portion 2011 has a thickness gradually changed, that is, the first pixel defining portion 2011 has an inclined inner side surface which is connected to the upper surfaces of the first and second pixel defining portions 2011 and 2012, but the embodiments of the present invention are not limited thereto. The first pixel defining portion 2011 may also have a constant thickness, that is, the first pixel defining portion 2011 may have a vertical inner side surface.

FIG. 2 illustrates that the organic-light-emitting-display-device functional layer 203 fits and is in contact with an inner side surface of the first pixel defining portion 2011, but the embodiments of the present invention are not limited thereto. Other layer(s) may be interposed between the organic-light-emitting-display-device functional layer 203 and the first pixel defining portion 2011.

Optionally, the thickness of the second pixel defining portion 2012 is equal to or greater than that of the first electrode 202, and it is preferable that the second pixel defining portion 2012 and the first electrode 202 have the same thickness. The thickness of the first electrode 202 may range from 10 nm to 400 nm.

The first electrode 202 and the second electrode 204 constitute a pair of pixel electrodes. The first electrode 202 may be an anode or a cathode. In the case that the first electrode 202 is an anode, the material thereof may include a transparent conductive material or a translucent conductive material, such as ITO, Ag, NiO, Al or graphene. In the case that the first electrode 202 is a cathode, preferably, the material thereof may include a metal or a combination of metals having a low work function, such as one of Al, Mg, Ca, Ba, Na, Li, K and Ag, or any combination of Al, Mg, Ca, Ba, Na, Li, K and Ag.

Optionally, when viewed in a plan view, a shape of the first electrode 202 may include a parallelogram shape, such as a rectangle shape, a square shape or a diamond shape, or an ellipse shape. Depending on the requirements in practice applications, the first electrode 202 may also include any other shape, for example, a quadrangle having any specific shape.

Optionally, the organic-light-emitting-display-device functional layer 203 may include one or more layers of a hole injection layer, a hole transmission layer, a light emitting layer, a hole barrier layer, an electron barrier layer, an electron transmission layer and an electron injection layer.

The second electrode 204 has a polarity opposite to that of the first electrode 202, that is, the first electrode 202 is one of the anode and the cathode, and the second electrode 204 is the other thereof. In the case that the second electrode 204 is a cathode, the material thereof may include a metal or a combination of metals having a low work function, such as one of Al, Mg, Ca, Ba, Na, Li, K and Ag, or any combination of Al, Mg, Ca, Ba, Na, Li, K and Ag. In the case that the second electrode 204 is an anode, the material thereof may include a transparent conductive material or a translucent conductive material, such as ITO, Ag, NiO, Al or graphene.

In the pixel unit according to the embodiments of the present invention, the organic-light-emitting-display-device functional layer 203 is positioned on the first electrode 202 and the second pixel defining portion 2012, and the area of the bottom plane of the organic-light-emitting-display-device functional layer 203 is larger than that of the upper surface of the first electrode 202. Therefore, in the case that the thickness of the edge area of the organic-light-emitting-display-device functional layer 203 is greater than that of the central area of the organic-light-emitting-display-device functional layer 203, since the first electrode 202 is not disposed under the edge area, light may not be emitted from the edge area of the organic-light-emitting-display-device functional layer 203 when a voltage is applied to the organic-light-emitting-display-device functional layer 203 by the electrodes 202 and 204, thereby avoiding the non-uniformity of luminance of an organic light-emitting display device.

Optionally, the pixel unit may be an organic light-emitting diode (OLED) unit.

The embodiments of the present invention further include a display panel comprising the above pixel unit. The display panel may be an OLED display panel.

Figure 4:
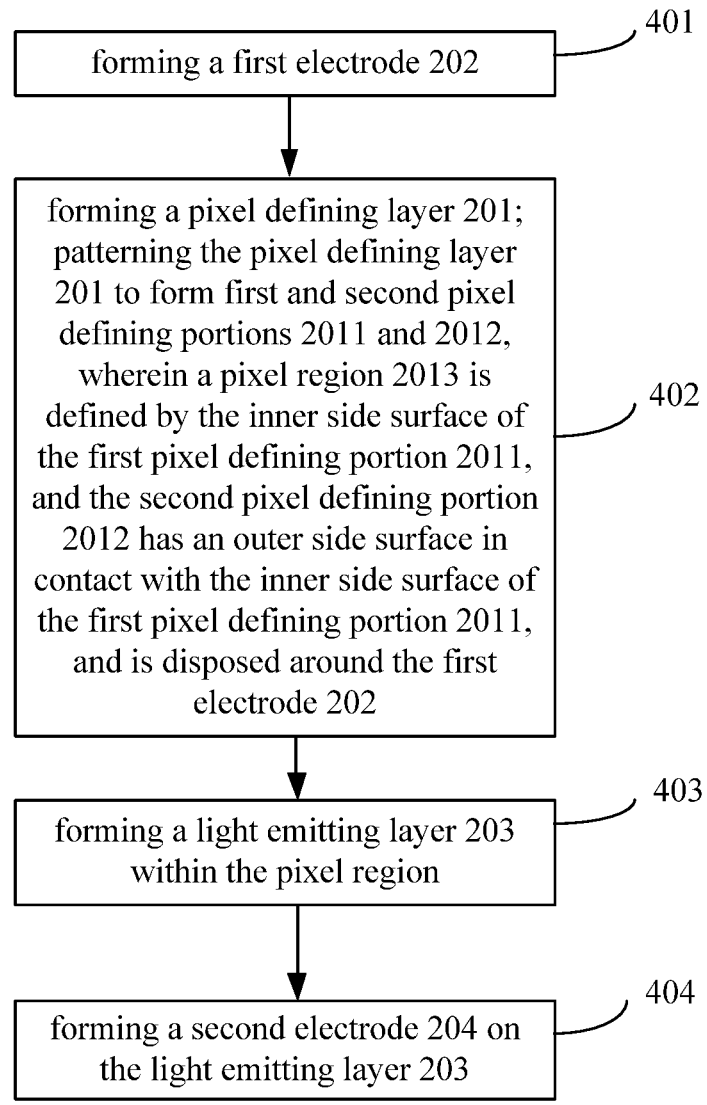
FIG. 4 is a flowchart of a method of manufacturing a pixel unit, according to an embodiment of the present invention.

FIG. 4 illustrates a flowchart of a method of manufacturing a pixel unit, according to an embodiment of the present invention. FIGS. 5(A) to 5(E) are cross-sectional views illustrating the method of manufacturing a pixel unit, according to an embodiment of the present invention.

As illustrated in FIG. 4, the method of manufacturing a pixel unit according to an embodiment of the present invention may include a step 401, a step 402, a step 403 and a step 404.

Figure 5A:
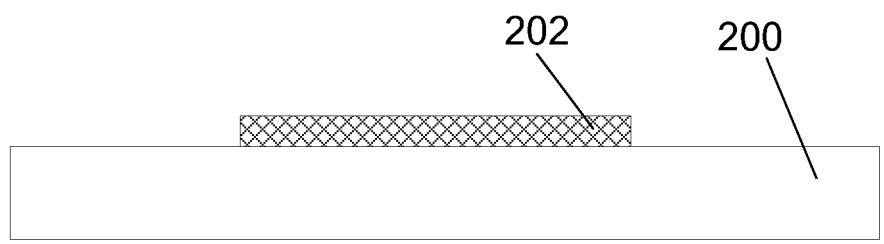
FIGS. 5(A) to 5(E) are cross-sectional views illustrating the method of manufacturing a pixel unit, according to an embodiment of the present invention.

In the step 401, as illustrated in FIG. 5(A), a first electrode 202 is formed.

Figure 5B:
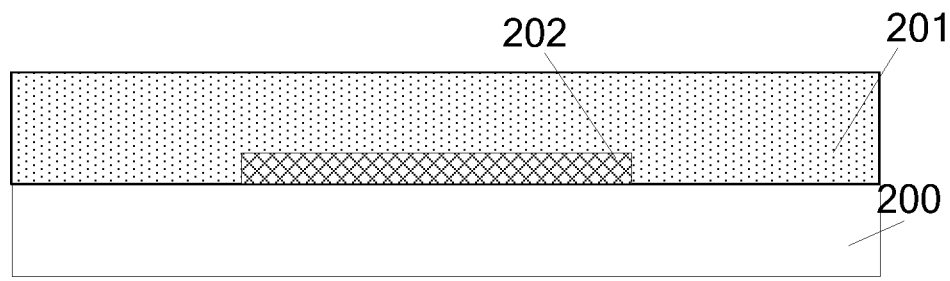
Figure 5C:
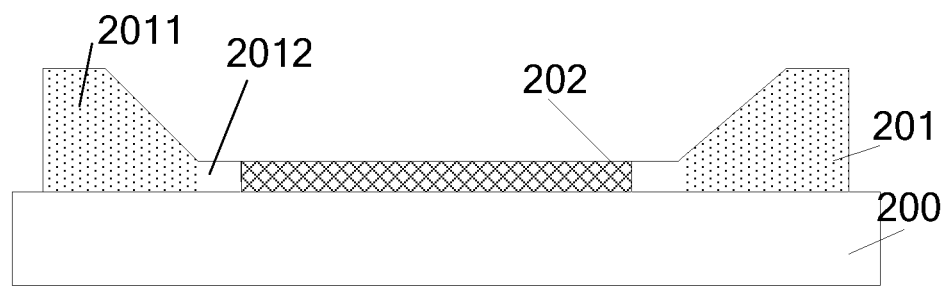

In the step 402, as illustrated in FIG. 5(B), a pixel defining layer 201 is formed. Then, the pixel defining layer 201 is patterned to form a first pixel defining portion 2011 and a second pixel defining portion 2012, wherein a pixel region is defined by an inner side surface of the first pixel defining portion 2011, an outer side surface of the second pixel defining portion 2012 is in contact with the inner side surface of the first pixel defining portion 2011, and the second pixel defining portion 2012 is disposed around the first electrode 202, as illustrated in FIG. 5(C). The second pixel defining portion 2012 has a thickness equal to or slightly greater than that of the first electrode 202. Optionally, the second pixel defining portion 2012 is in contact with the first electrode 202.

Optionally, the step 402 may specifically comprise the following steps: forming, on a substrate 200 provided with the first electrode 202, the pixel defining layer; performing a photolithography process on the pixel defining layer, such that an area of an exposure region is larger than that of the upper surface of the first electrode 202; and removing the material of the pixel defining layer positioned on the upper surface of the first electrode 202 and thinning a side portion of the pixel defining layer, which is close to an edge of the first electrode 202, so as to form the first pixel defining portion 2011 and the second pixel defining portion 2012.

Optionally, the pixel defining layer 201 may be made of an inorganic material such as $SiO_2$, $SiN_x$ or the like, and may also be made of an organic material such as a photoresist and the like.

In the case that the pixel defining layer 201 is made of an inorganic material, the step 402 may further comprise: forming, on the substrate provided with the first electrode, a layer of inorganic material by using a technology such as chemical vapor deposition, the layer of inorganic material may have a thickness ranging from 100 nm to 400 nm, which is greater than the thickness of the first electrode 202. Next, a photoresist is spin coated on the layer of inorganic material and is exposed and developed, where the exposure area of the photoresist is larger than that of the upper surface of the first electrode 202. Thereafter, the layer of inorganic material is dry etched to remove the inorganic material positioned on the upper surface of the first electrode 202, and a side portion of the layer of inorganic material close to an edge of the first electrode 202 is thinned, such that the thickness of the inorganic material close to the edge of the first electrode 202 is equal to or slightly greater than that of the first electrode 202, and then the remaining photoresist is removed, so as to form the first pixel defining portion 2011 and the second pixel defining portion 2012.

In the case that the pixel defining layer 201 is made of an organic material, the step 402 may further comprise: coating, on the substrate provided with the first electrode, an organic photoresist material by coating processes such as slit coating, spin coating and the like, to form an organic thin film having a thickness ranging from 100 nm to 2000 nm, wherein the thickness of the organic photoresist material is greater than that of the first electrode 202. Thereafter, the organic photoresist material is exposed and developed, and the exposure area of the photoresist is larger than that of the upper surface of the first electrode 202. When performing the exposure, the photoresist positioned on the upper surface of the first electrode 202 is over exposed to be removed completely, while the exposure amount for exposing the photoresist close to the edge portion of the first electrode 202 is controlled such that the developed photoresist has a thickness equal to or slightly greater than that of the first electrode 202, thereby eventually forming the first pixel defining portion 2011 and the second pixel defining portion 2012.

Figure 5D:
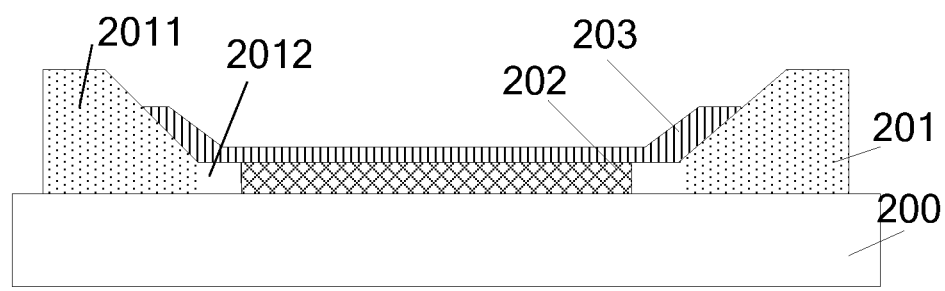

In the step 403, an organic-light-emitting-display-device functional layer 203 is formed on the first electrode 202 and the second pixel defining portion 2012, and the organic-light-emitting-display-device functional layer 203 fits and is in contact with the inner side surface of the first pixel defining portion 2011, as illustrated in FIG. 5(D).

Optionally, in the step 403, the organic-light-emitting-display-device functional layer 203 may be formed by a solution process and/or an evaporation process. As an example, the formation of the organic-light-emitting-display-device functional layer 203 may specifically include: forming a hole injection layer, a hole transmission layer, a light emitting layer and the like within the pixel region 2013, respectively, by using the inkjet printing technology, and forming an electron transmission layer, an electron injection layer and the like by using the evaporation process.

Figure 5E:
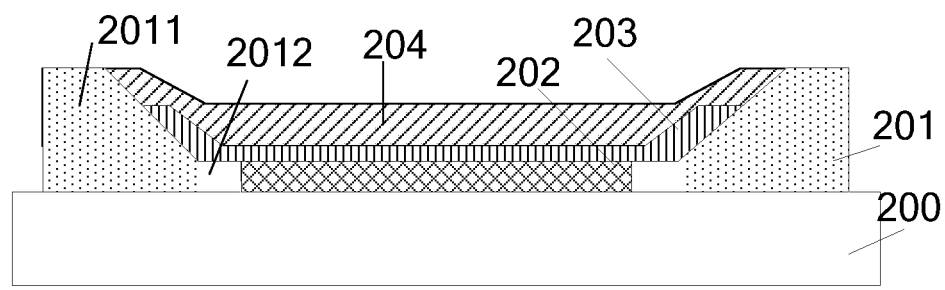

In the step 404, a second electrode 204 is formed on the organic-light-emitting-display-device functional layer 203, as illustrated in FIG. 5(E).

The method of manufacturing the pixel unit according to the embodiments of the present invention is particularly applicable to the manufacture of the pixel unit by the solution process. Compared with the conventional technologies, the pixel unit manufactured by the method according to the embodiments of the present invention has a first electrode, of which the upper surface has an area smaller than that of the pixel region defined by the pixel defining layer. As such, even in the case that the thickness of the edge area of the organic-light-emitting-display-device functional layer is greater than that of the central area thereof, since the first electrode is not provided under an edge area of the thin film of the organic-light-emitting-display-device functional layer, light is not emitted from the edge area of the organic-light-emitting-display-device functional layer when a voltage is applied to the thin film of the organic-light-emittingdisplay-device functional layer by the electrodes, thereby avoiding the nonuniformity of luminance of an organic light-emitting display device.

The objects, the technical solutions and the advantageous effects of the present invention are further explained in detail in the above-mentioned specific embodiments, and it should be understood that the above are merely specific embodiments of the present invention which are not intended to limit the present invention thereto. Any variation, equivalent alternation and improvement within the spirit and essence of the present invention shall fall into the protection scope of the present invention.

What is claimed is:

1. A pixel unit, comprising:
    a pixel defining layer that defines a pixel region;
    a first electrode positioned within a central area of the pixel region;
    an organic-light-emitting-display-device functional layer, which is formed within the pixel region and positioned on the first electrode; and
    a second electrode formed on the organic-light-emitting-display-device functional layer,
    wherein an area of a bottom plane of the organic-light-emitting-display-device functional layer is larger than that of an upper surface of the first electrode, and
    wherein the pixel defining layer is configured to contact with a side surface of the first electrode and not contact with remaining surfaces of the first electrode.

2. The pixel unit according to claim 1, wherein the pixel defining layer comprises first and second pixel defining portions having ring-shaped structures, respectively, the first pixel defining portion has an inner side surface defining the pixel region, and the second pixel defining portion has an outer side surface in contact with the inner side surface of the first pixel defining portion, and is disposed around the first electrode, wherein the organic-light-emitting-display-device functional layer is positioned on the first electrode and the second pixel defining portion.

3. The pixel unit according to claim 2, wherein the first pixel defining portion has a thickness greater than that of the second pixel defining portion.

4. The pixel unit according to claim 2, wherein the second pixel defining portion is in contact with the first electrode.

5. The pixel unit according to claim 2, wherein the first pixel defining portion has an inclined inner side surface.

6. The pixel unit according to claim 2, wherein the second pixel defining portion has a thickness equal to or greater than that of the first electrode.

7. The pixel unit according to claim 2, wherein the first pixel defining portion and the second pixel defining portion are formed integrally.

8. The pixel unit according to claim 6, wherein the thickness of the first electrode ranges from 10 nm to 400 nm.

9. A light emitting device, comprising the pixel unit according to claim 1.

10. A display device, comprising the light emitting device according to claim 9.

11. A method of manufacturing a pixel unit, comprising steps of:
    forming a first electrode;
    forming a pixel defining layer and patterning the pixel defining layer, so as to define a pixel region and make the first electrode positioned within a central area of the pixel region;
    forming an organic-light-emitting-display-device functional layer on the first electrode, wherein a bottom plane of the organic-light-emitting-display-device functional layer has an area larger than that of an upper surface of the first electrode; and
    forming a second electrode on the organic-light-emitting-display-device functional layer,
    wherein the pixel defining layer is formed to contact with a side surface of the first electrode and not contact with remaining surfaces of the first electrode.

12. The method according to claim 11, wherein
    the pixel defining layer includes first and second pixel defining portions having ring-shaped structures, respectively, the first pixel defining portion has an inner side surface defining the pixel region, the second pixel defining portion has an outer side surface in contact with the inner side surface of the first pixel defining portion, and is disposed around the first electrode.

13. The method according to claim 12, wherein the first pixel defining portion has a thickness greater than that of the second pixel defining portion.

14. The method according to claim 12, wherein the step of forming the pixel defining layer comprises:
    forming the pixel defining layer on the first electrode;
    performing, on the pixel defining layer on the first electrode, a photolithography process, such that an area of an exposure region is larger than that of the upper surface of the first electrode; and
    removing the material of the pixel defining layer positioned on the upper surface of the first electrode, and thinning a side portion of the pixel defining layer, which is close to an edge of the first electrode, so as to form the first pixel defining portion and the second pixel defining portion.

15. The method according to claim 14, wherein the pixel defining layer is formed of an inorganic material, and the step of forming the pixel defining layer comprises:
    forming, on the first electrode, a layer of inorganic material;
    exposing, by using photoresist, and developing the inorganic material positioned on the first electrode, such that an area of an exposure region is larger than that of the upper surface of the first electrode; and
    removing the inorganic material positioned on the upper surface of the first electrode by dry etching, and thinning the side portion of the pixel defining layer, which is close to an edge of the first electrode, so as to form the first pixel defining portion and the second pixel defining portion.

16. The method according to claim 14, wherein the pixel defining layer is formed of a photoresist, and the step of forming the pixel defining layer comprises steps of:
    forming, on the first electrode, a layer of photoresist; and
    exposing and developing the photoresist positioned on the first electrode, such that an area of an exposure region is larger than that of the upper surface of the first electrode, wherein the photoresist on the upper surface of the first electrode is over exposed, and an exposure amount is controlled when exposing the photoresist close to the edge of the first electrode, such that the developed photoresist has a thickness equal to or greater than that of the first electrode, so as to form the first pixel defining portion and the second pixel defining portion.

17. The method according to claim 11, wherein the organic-light-emitting-display-device functional layer is formed by a solution process or an evaporation process.

18. The method according to claim 13, wherein the step of forming the pixel defining layer comprises:
- forming the pixel defining layer on the first electrode;
- performing, on the pixel defining layer on the first electrode, a photolithography process, such that an area of an exposure region is larger than that of the upper surface of the first electrode; and
- removing the material of the pixel defining layer positioned on the upper surface of the first electrode, and thinning a side portion of the pixel defining layer, which is close to an edge of the first electrode, so as to form the first pixel defining portion and the second pixel defining portion.

19. The pixel unit of claim 1, wherein the second electrode is at a side of the organic-light-emitting-display-device functional layer distal to the first electrode.

20. The pixel unit of claim 2, wherein each of the organic-light-emitting-display-device functional layer and the second electrode is configured to contact with the inner side surface of the first pixel defining portion.

* * * * *